(12) United States Patent
Hickey

(10) Patent No.: US 7,043,910 B2
(45) Date of Patent: May 16, 2006

(54) THERMAL ACTUATOR

(75) Inventor: Ryan Murray Hickey, Ontario (CA)

(73) Assignee: Bookham Technology PLC, Abingdon (GB)

( * ) Notice: Subject to any disclaimer, the term of this patent is extended or adjusted under 35 U.S.C. 154(b) by 59 days.

(21) Appl. No.: 10/819,457

(22) Filed: Apr. 7, 2004

(65) Prior Publication Data

US 2004/0261412 A1   Dec. 30, 2004

Related U.S. Application Data

(60) Provisional application No. 60/320,098, filed on Apr. 8, 2003.

(51) Int. Cl.
*F01B 29/10* (2006.01)

(52) U.S. Cl. ........................... 60/527; 60/528

(58) Field of Classification Search ................. 60/527, 60/528; 310/307, 308
See application file for complete search history.

(56) References Cited

U.S. PATENT DOCUMENTS

| | | | | |
|---|---|---|---|---|
| 4,688,885 | A * | 8/1987 | Poteat et al. | 385/90 |
| 5,726,480 | A * | 3/1998 | Pister | 257/415 |
| 5,962,949 | A * | 10/1999 | Dhuler et al. | 310/307 |
| 6,070,656 | A * | 6/2000 | Dickey | 165/104.26 |
| 6,483,419 | B1 | 11/2002 | Weaver et al. | |
| 6,531,947 | B1 | 3/2003 | Weaver et al. | |
| 2003/0002133 | A1 | 1/2003 | Hanson et al. | |

FOREIGN PATENT DOCUMENTS

WO   WO 02/17339   2/2002

OTHER PUBLICATIONS

Field, L.; Burriescic, D.; Robrish, P.; Ruby, R.; "Micromachines 1X2 Optical Fiber Switch"; The 8th International Conference on Solid State Sensors and Actuators, and Eurosensors IX; Jun. 25-29, 1995; pp. 344-347; Stockholm, SWEDEN.

Lioa, K.; Chueh, C.; Chen, R.; "A Novel Electro-Thermally Driven Bi-directional Microactuator"; International Symposium on Micromechatronics and Human Science; 2002; pp. 267-274; IEEE; USA.

Kolesar, E. et al.; "Single- and double-hot arm asymmetrical polysilicon surface micromachined electrothermal microactuators applied to realize a microengine"; Thin Solid Films; 2002; pp. 530-538; Elsevier Science B. V.; USA.

* cited by examiner

*Primary Examiner*—Hoang Nguyen
(74) *Attorney, Agent, or Firm*—Lawrence E. Laubscher, Jr.

(57) ABSTRACT

An asymmetric MEMS thermal actuator device includes a base portion, typically a pair of bond pads, and an actuator element connected to the base portion by a flexure portion. The actuator element has a first arm and a second arm alongside the first arm and spaced from the first arm. The second arm is wider than the first arm so that the actuator element deflects about the flexure element due to differential heating in the first and second arms when an electrical current is passed therethrough. A cut-out portion is provided in the second arm adjacent the first arm so as to increase the spacing therefrom over at least a portion of the second arm. Preferably, a heat sink is also provided laterally adjacent the second arm.

15 Claims, 3 Drawing Sheets

THERMAL ACTUATOR

CROSS REFERENCE TO RELATED APPLICATION

This application claims the benefit under 35 USC 119(e) of U.S. provisional application Ser. No. 60/320,098 filed Apr. 8, 2003.

FIELD OF THE INVENTION

This invention relates to micro-electromechanical systems (MEMS) devices, and in particular to an asymmetric thermal actuator suitable for use as a variable optical attenuator in fiber optic systems.

BACKGROUND OF THE INVENTION

Variable Optical Attenuators (VOAs) are used in fiber optic systems to control the amount of light falling, for example, on a detector. For this purpose, it is known to use an asymmetric style MEMS electro thermal actuator. This can be fabricated using bulk silicon-on-insulator wafers. A known asymmetric actuator consists of a cantilevered electrical loop having a narrow hot arm, a wide cold arm and a narrow flexure element. When current is passed through the loop, the narrow arm heats up more than the wide cold arm, and as a result causes the actuator to flex about the narrow flexure portion connecting the movable arms to the stationary substrate. A typical prior art MEMS thermal actuator is described in U.S. Pat. No. 6,275,320, dated Aug. 14, 2001, the contents of which are herein described by reference.

In order to obtain as large a deflection as possible, the variables that affect both the heat transfer and deflection mechanics should be optimized. Intuitively, it may seem desirable to make the wide arm as narrow as possible to facilitate more bending while keeping it wide enough to maintain the low temperature. However, according R. Hickey et. al., the cold arm should be as stiff as possible in order to force all the rotation to take place near in the flexure portion, thereby increasing the deflection.

It is known that a fully suspended actuator can be realized by using silicon on insulator wafers and fully etching the backside handle wafer under the device. The use of a fully suspended structure eliminates the possibility of stiction to the substrate, ensures that the buried oxide can be fully etched and reduces the power required to move the actuator by eliminating the large heat load created by a thick redundant substrate. Fully suspending the actuator in this manner removes the underlying substrate heat sink. However, the problem with removing the substrate heat sink is that the thermal gradients set up within the air surrounding the device become altered. A large envelope of quiescent air surrounds the hot arm. Without the substrate, a significant amount of heat is transferred through the air to the cold arm. As a result, the cold arm expands, the moment decreases and the actuator deflection drops.

It would in theory be possible to separate the two arms separated further. However, separation of the two arms reduces the amount of deflection.

SUMMARY OF THE INVENTION

In order to improve the efficiency of the actuator in terms of microns of motion of the actuator per Watt, in accordance with the invention the cold arm is spaced further away from the hot arm to reduce the heat transfer through the air while maintaining its stiffness. The size of the flexure element and the hot arm spacing to flexure element spacing are preserved to maintain the optimum deflection mechanics. In addition, a heat sink can be been added either to the substrate layer or device layer to further improve the temperature difference and thereby increase the deflection of the actuator arm. These changes also reduce the temperature required to attain the same deflection.

According to the present invention there is provided an asymmetric MEMS thermal actuator device comprising a base portion; and an actuator element connected to said base portion by a flexure portion, said actuator element comprising a first arm and a second arm alongside said first arm and being spaced therefrom, said second arm being wider than said first arm so that said actuator element deflects about said flexure element due to differential heating in said first and second arms when an electrical current is passed therethrough, and wherein a cut-out region facing said first arm is provided in said second arm so as to increase the spacing of said second arm from said first arm in said cut-out region.

A heat sink, preferably in the same MEMS layer as the actuator element, can be provided near the second arm. Alternatively, the heat sink can be provided in the substrate to the side of the actuator arm.

Preferably, the thermal actuator is a silicon-on-insulator device.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

Figure 1:
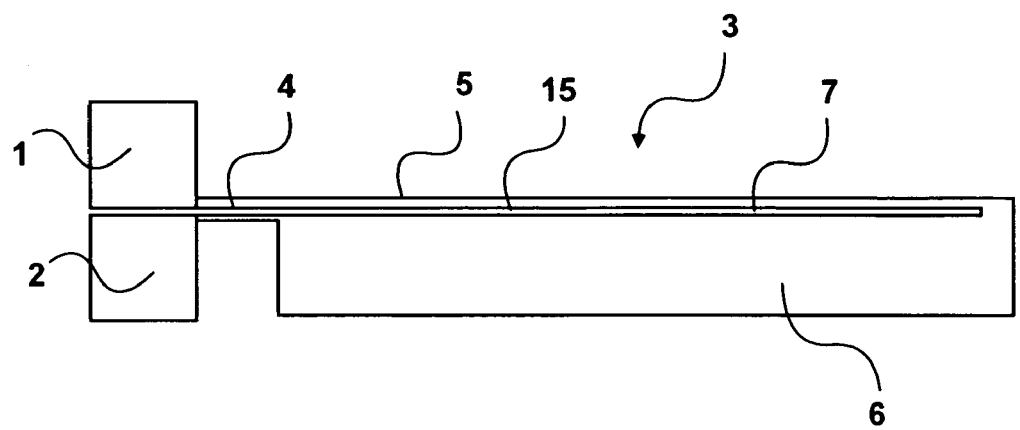
FIG. 1 a schematic view of a prior art asymmetric thermal actuator.

The standard asymmetric style thermal actuator commonly used in the MEMS community and schematically shown in FIG. 1 comprises a pair of stationary bond pads 1, 2 and an actuator element 3 connected to the bond pads by a narrow flexure portion 4.

The actuator element 3, which is formed from a common layer of silicon on an insulator substrate, comprises a long narrow hot arm 5 extending alongside and spaced from a wider cold arm 6 by a small gap 7. The actuator element 3 is formed from a single layer of silicon using MEMS technology.

The actuator element 3 is in the form of a wire formed in a generally U-shape configuration. A current driven through the actuator element between the bond pads 1, 2, from which the arms 5, 6 extend, causes one side of the device to heat and expand more than the other due to the different resistance of the two arms. This difference in thermal expansion sets up an internal mechanical moment and causes the actuator element 3 to deflect toward the cold arm 6. The shape or size difference between the two arms creates the temperature difference.

The hot arm 5 consists of one long narrow arm extending to the bond pad 1 while the cold arm 6 consists of a long wide section and a short section of reduced width in the flexure portion 4. The flexure portion 4 permits bending of the structure consisting of the two arms 5, 6 due to differential heating effects. The wider side has a lower current density and therefore does not heat as much as the narrow arm as the current flows through the actuator element 3.

There is an optimum spacing between the hot side and cold side that governs the maximum deflection. This spacing, which is in the order of 7 microns, is small compared to the spacing required to reduce the heat transfer. The cold arm 6 should also be as stiff as possible.

Figure 2:
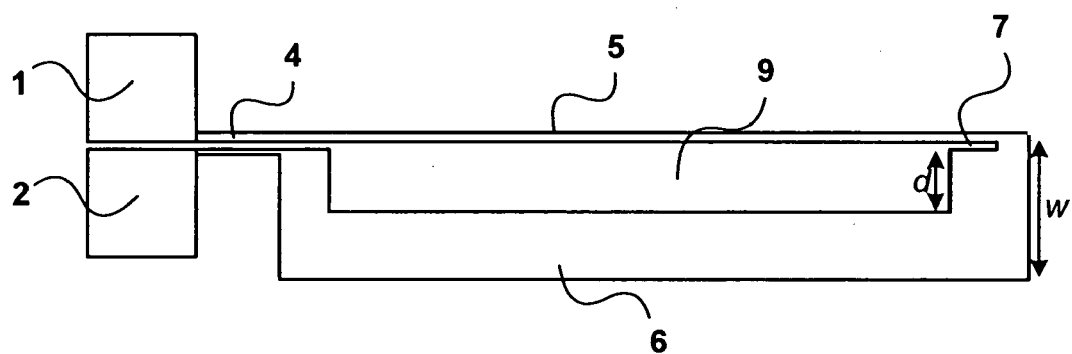
FIG. 2 is a schematic view of an asymmetric thermal actuator with cold arm cut out in accordance with an embodiment of the invention.

In accordance with one embodiment of the invention, the cold arm is provided with a rectangular recess or cut-out 9 that effectively places the cold arm 6 in the recess further away from the hot arm 5 while maintaining the spacing within the flexure portion 4 as shown in FIG. 2. The spacing between the arms 5, 6 within the flexure portion 4 is the same as in the prior art shown in FIG. 1. In this way, the stiffness of the actuator element 3 is maintained while a reduction in the transfer of heat across the air gap is achieved. It will be appreciated that the cut-out need not be rectangular and can other suitable shapes.

The dimensions of the device can vary, but typically the length of the actuator is about 1 mm and the width of the air gap 15 between the hot and cold arms is about 7 microns, although it could be anywhere from about 2 to 20 microns.

In the exemplary embodiment, the width w of the actuator element is about 90 to 100 microns with the depth d of the cut-out 9 being about 50 microns. Typically, the depth of the cut-out is about half the width of the cold arm.

The actuator element is made of silicon, which has a high thermal conductivity. This permits heat transfer from the hot side to the cold side directly through the silicon.

Figure 3:
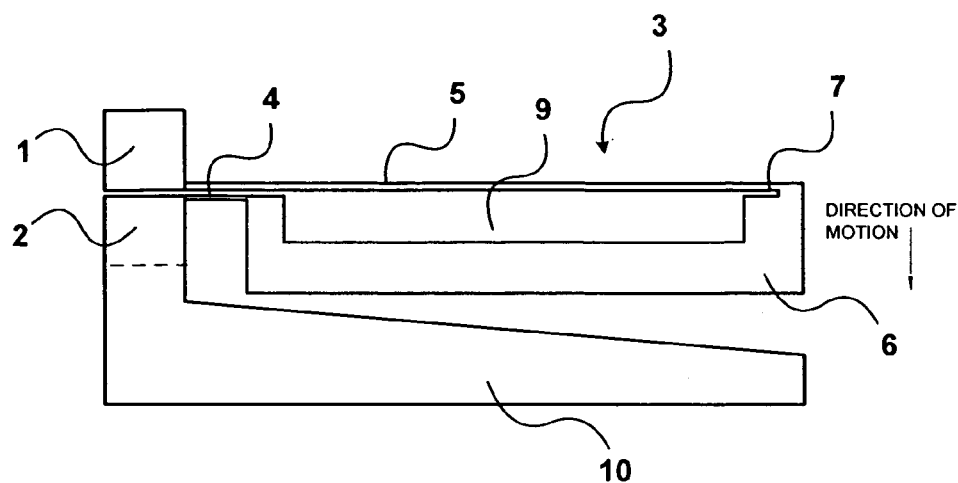
FIG. 3 is a schematic view of an asymmetric thermal actuator with cold arm cut out and device layer heat sink in accordance with a second embodiment of the invention.

In order to further enhance the performance, a separate heat sink 10 can be added in the silicon layer as shown in FIG. 3 to the side of the actuator element 3. The heat sink is tapered toward its free end so as to allow for the deflection of the actuator element 3 toward it. The location of the heat sink to the side of the actuator element ensures that excess heat from the hot air can be dissipated without significantly heating the cold arm.

Figure 4:
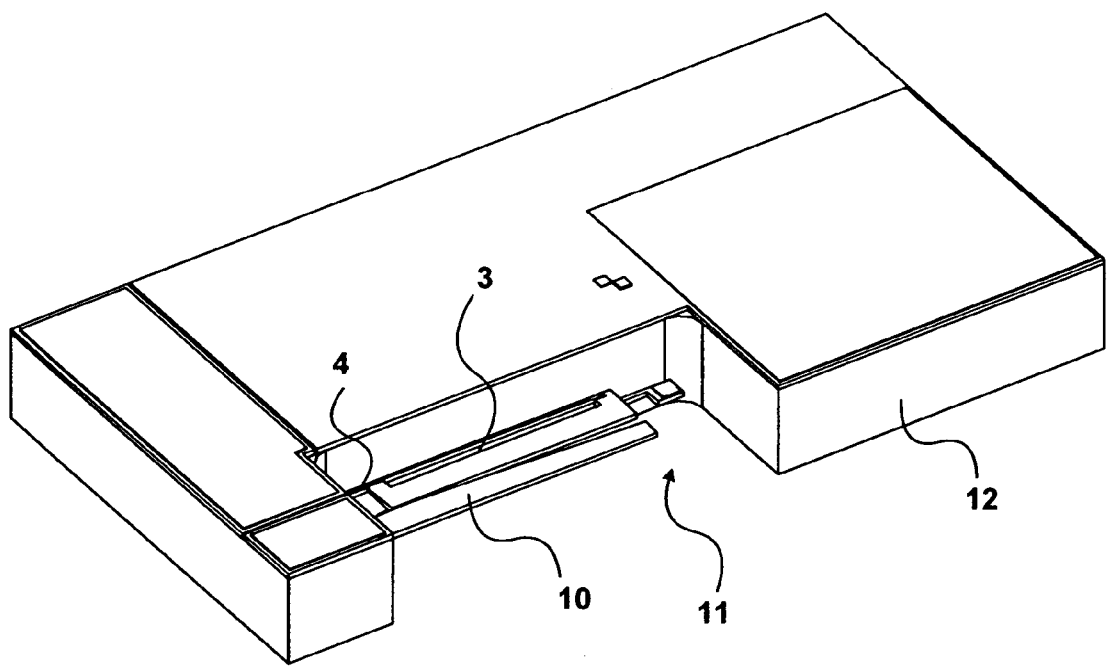
FIG. 4 is a schematic perspective view of a MEMS VOA Chip with heat sink in the device layer.

FIG. 4 is a plan view of a thermal actuator in a MEMS VOA chip. The actuator element 3 is located in a cavity 11 etched into the silicon substrate 12. The heat sink 10 is located to the side of the actuator element as shown in FIG. 3.

Figure 6:
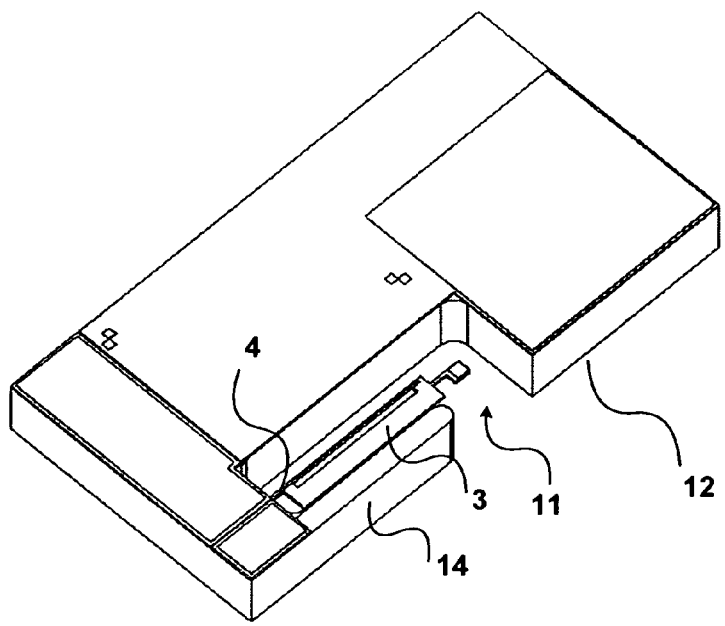
FIG. 6 is a schematic perspective view of a MEMS VOA chip with heat sink in the substrate.

In an alternative embodiment, shown in FIG. 6, the heat sink is formed from the substrate 12 generally within the cavity 11 but to the side of the actuator element 3 and substantially underneath the region occupied by the heat sink 10 in the embodiment shown in FIG. 3. The heat sink 14, which is at a lower level than the actuator element 3, consists of a generally rectangular protruding portion of substrate 12 with a rounded tip.

In the embodiment of FIG. 6, the actuator element 3, as it deflects, moves toward, and starts to overlap, a portion of the heat sink 14. This arrangement of the heat sink 14 located to the side of the actuator element 3 does not create the stiction problems present in the prior art where the heat sink was located directly under the actuator element 3.

The device is fabricated using existing silicon on insulator MEMS technology. The substrate 12 is made of silicon with a surface oxide layer providing the insulator on the front side of the substrate. The device, consisting of the actuator element, heat sink 10, and bond pads 1, 2 is etched out an active silicon layer deposited on the oxide insulator. The substrate 12 is then etched from the backside of the substrate to form the cavity 11.

Figure 5:
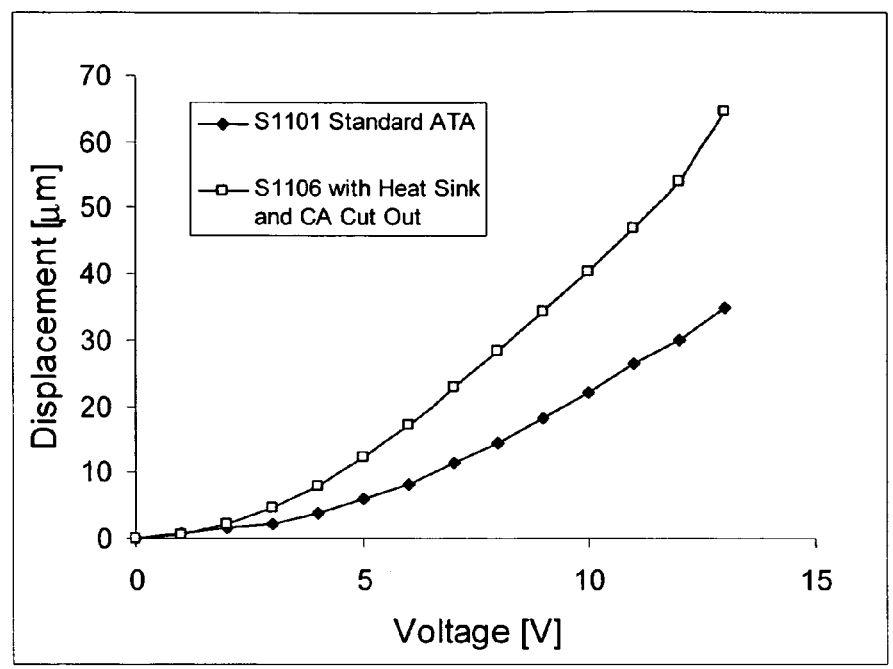
FIG. 5 is a graphic comparison of new actuator with heat sink and cold arm cut out with standard asymmetric style actuator.

FIG. 5 shows measured results depicting the performance of the new actuator element 3 compared to a conventional asymmetric style actuator as shown in FIG. 1. It will be noted that the novel actuator element shows a significant improvement in displacement per unit of voltage. For example, at 10 V, the deflection changes by a factor of about 2 from 20 to 40 microns.

It will be appreciated that persons skilled in the art will recognize that many variations of the invention are possible without departing from the scope of the appended claim.

I claim:

1. An asymmetric MEMS thermal actuator device comprising:
    a base portion; and
    an actuator element connected to said base portion by a flexure portion, said actuator element comprising a first arm and a second arm extending alongside said first arm and being spaced therefrom, said first and second arms lying in a substantially common plane, and said first and second arms each having a proximal end and a distal end, said first and second arms being electrically interconnected at said distal end, and said second arm being wider than said first arm so that said actuator element deflects about said flexure element portion in said common plane due to differential heating in said first and second arms when an electrical current is passed through said first and second arms from the proximal end of one of said arms to the proximal end of the other of said arms; and
    wherein a recess facing said first arm is provided in said second arm so as to increase the spacing of said second arm from said first arm in said recess.

2. An asymmetric MEMS thermal actuator device as claimed in claim 1, wherein said recess is rectangular in shape.

3. An asymmetric MEMS thermal actuator device as claimed in claim 1, wherein said base portion comprises a pair of bond pads attached to said respective first and second arms at their proximal ends.

4. An asymmetric MEMS thermal actuator device as claimed in claim 1, further comprising a heat sink laterally adjacent said second arm.

5. An asymmetric MEMS thermal actuator device as claimed in claim 4, wherein said heat sink tapers away from said actuator element from a root portion of said heat sink to a tip thereof to permit deflection of said actuator element.

6. An asymmetric MEMS thermal actuator device as claimed in claim 5, wherein said heat sink forms part of the same layer as said actuator element.

7. An asymmetric MEMS thermal actuator device as claimed in claim 5, wherein said same layer is a silicon layer.

8. An asymmetric MEMS thermal actuator device as claimed in claim 4, wherein said heat sink forms part of a substrate for said actuator element and is located beside and below said actuator element so that as said actuator element deflects, said actuator element partly overlaps said heat sink.

9. An asymmetric MEMS thermal actuator device as claimed in claim 1, wherein said actuator element is made of a silicon layer deposited on an insulating substrate.

10. An asymmetric MEMS thermal actuator device as claimed in claim 1, wherein said insulator is silicon oxide deposited on a silicon substrate.

11. An asymmetric MEMS thermal actuator device as claimed in claim 1, wherein the depth of said recess is about half the width of said cold arm.

12. An asymmetric MEMS thermal actuator device as claimed in claim 1, wherein the depth of the recess is about 50 microns.

13. An asymmetric MEMS thermal actuator device comprising:

a base portion; and an actuator element connected to said base portion by a flexure portion, said actuator element comprising a first arm and a second arm alongside said first arm and being spaced therefrom, said second arm being wider than said first arm so that said actuator element deflects about said flexure portion due to differential heating in said first and second arms when an electrical current is passed through said first and second arms;

a protruding heat sink located to the side of said actuator element; and wherein a recess facing said first arm is provided in said second arm so as to increase the spacing of said second arm from said first arm in said recess.

14. An asymmetric MEMS thermal actuator device as claimed in claim 13, wherein said heat sink is at the same level as said actuator element.

15. An asymmetric MEMS thermal actuator device as claimed in claim 13, wherein said heat sink is below said actuator element.

* * * * *